United States Patent [19]

Tice et al.

[11] Patent Number: 5,530,444
[45] Date of Patent: Jun. 25, 1996

[54] DIFFERENTIAL AMPLIFIERS WHICH CAN FORM A RESIDUE AMPLIFIER IN SUB-RANGING A/D CONVERTERS

[75] Inventors: Thomas E. Tice, Greensboro; David T. Crook, Summerfield; Kevin M. Kattmann, Greensboro; Charles D. Lane, Greensboro all of N.C.

[73] Assignee: Analog Devices, Inc., Norwood, Mass.

[21] Appl. No.: 368,862

[22] Filed: Jan. 5, 1995

[51] Int. Cl.⁶ .............................. H03M 1/14; H03F 3/45
[52] U.S. Cl. ............................................ 341/156; 330/252
[58] Field of Search .................................. 330/252, 260; 341/156

[56] References Cited

U.S. PATENT DOCUMENTS

| | | | |
|---|---|---|---|
| 4,468,629 | 8/1984 | Choma, Jr. | 330/260 |
| 4,490,685 | 12/1985 | Sano et al. | 330/252 |
| 4,820,997 | 4/1989 | Sano et al. | 330/252 |
| 5,313,207 | 5/1994 | Kouno et al. | 341/156 |

OTHER PUBLICATIONS

William T. Colleran et al., "A 10–b, 75MHz Two–Stage Pipelined Bipolar A/D Converter", *IEEE Journal of Solid–State Circuits*, vol. 28, No. 12, Dec. 1993, pp. 1187–1199

Takahiro Miki, et al., "A 10–b, 50MS/s, 500–W A/D Converter Using a Differential–Voltage Subconverter", *IEEE Journal of Solid–State Circuits*, vol. 29, No. 4, Apr. 1994, pp. 516–521.

*Primary Examiner*—Howard L. Williams
*Attorney, Agent, or Firm*—Koppel & Jacobs

[57] ABSTRACT

Open-loop differential amplifiers (120, 140) are disclosed which have accurate and stable gain. The gain of these amplifiers is substantially insensitive to the effects of small-signal emitter resistance $r_e$, current gain $\beta$ and Early voltage $V_A$. Thus, their gain can be accurately set by resistance ratios which makes them particularly useful in integrated circuits. These advantages are obtained with an output differential pair (67) that has cross-coupled base and collector terminals. In addition, resistors (141, 143, 148, 150) and a current source (146) associated with this differential pair are related to like elements (27, 28, 24, 25 and 26) that are associated with an input differential pair (21) by disclosed numerical ratios, e.g., the nominal gain G of the amplifier. Versions of the amplifiers can be adapted for use as a residue amplifier (162) in a subranging A/D converter (160).

33 Claims, 9 Drawing Sheets

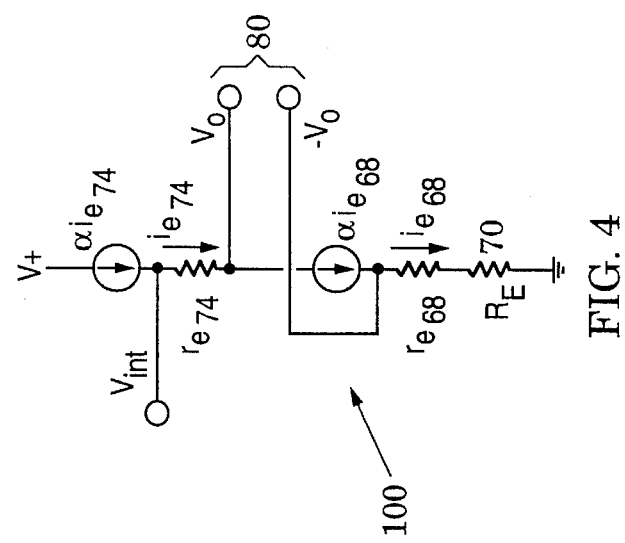
FIG. 3
FIG. 4
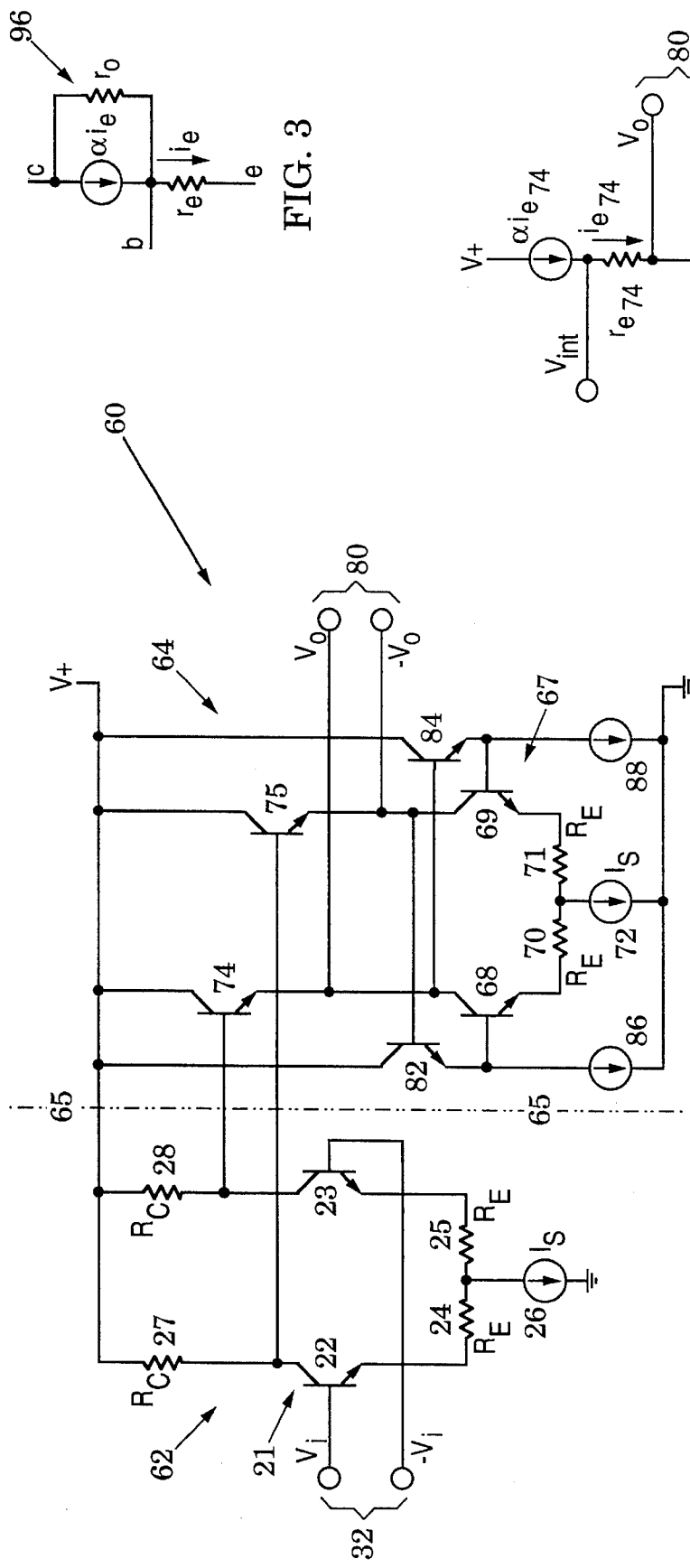
FIG. 2

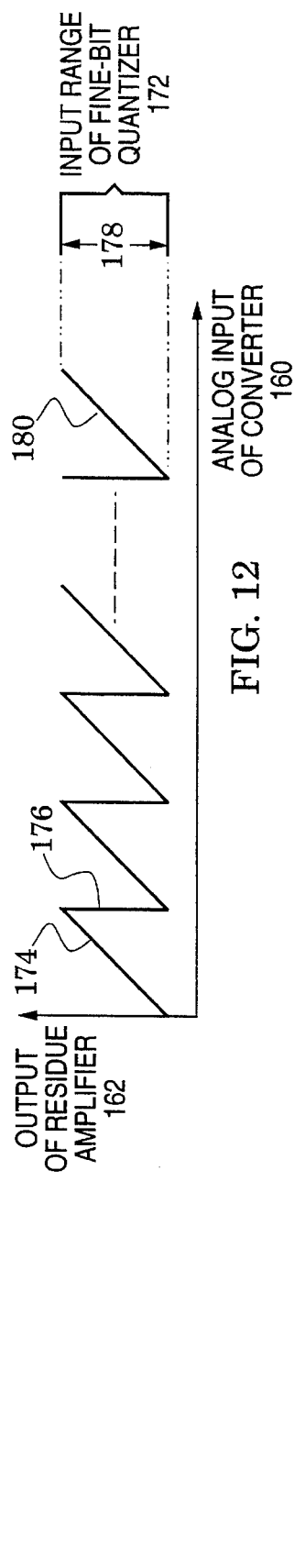
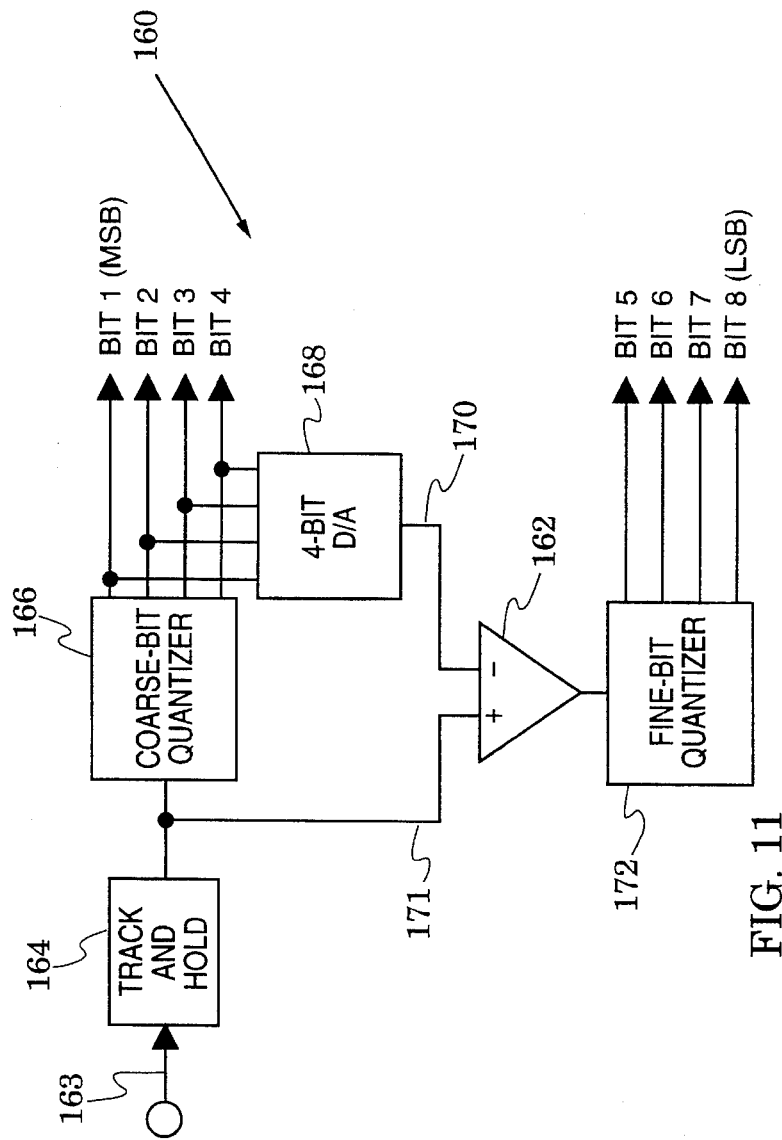
FIG. 12
FIG. 11

5,530,444

DIFFERENTIAL AMPLIFIERS WHICH CAN FORM A RESIDUE AMPLIFIER IN SUB-RANGING A/D CONVERTERS

BACKGROUND OF THE INVENTION

1. Field of the Invention

The present invention relates generally to differential amplifiers and more particularly to open-loop differential amplifiers.

2. Description of the Related Art

A differential amplifier is one whose output is proportional to the difference between two input signals. The input port of differential amplifiers is typically arranged to respond to signal differences and to suppress signals that are common to the inputs. Differential amplifiers are widely used in linear integrated circuits, e.g., they are a fundamental component of operational amplifiers. A basic building block of differential amplifiers is the differential pair; a pair of transistors whose emitters (sources) are coupled to a current source and whose bases (gates) form an input port. The difference in voltage at the input port steers the current of the current source between the collectors (drains).

FIG. 1A illustrates a typical differential amplifier 20 having a differential pair 21 of bipolar junction transistors 22 and 23. The emitters of the differential pair 21 have their emitters respectively coupled through source resistors 24 and 25 to a current source 26. The source resistors each have a resistance value of $R_E$. The collectors of the transistors are coupled to a supply voltage V+ by collector load resistors 27 and 28 which each have a resistance value of $R_C$. The base leads of the two transistors form a differential input port 32 and leads from their collectors form a differential output port 34. The differential voltage gain from input port 30 to output port 32 is given by an approximate gain expression of $R_C/R_E$.

This approximate gain expression ignores the effects of various transistor parameters which include the small-signal emitter resistance $r_e$ (resistance of the forward biased base-emitter junction), current gain $\beta$ (the ratio of collector current change to a change of base current) and the Early voltage $V_A$ (an imaginary voltage useful in defining an increase in collector current which occurs as the collector-emitter voltage is increased).

The emitter resistance $r_e$ modifies the differential amplifier's approximate gain expression because, in each of the transistors 22, 23, this resistance is in series with that transistors' external source resistor (24 or 25). Changes in current gain $\beta$ (e.g., because of temperature movement) cause current variations across load resistors which results in altered amplifier gain. The Early voltage is associated with collector current changes that result when the base width is modulated by variations in the collector-emitter voltage. These collector current variations cause undesirable changes in the amplifier gain.

All transistor parameters are sensitive to changes in operating conditions, e.g., temperature, bias current and supply voltage. Their values also vary across transistor production lots. Therefore, the differential amplifier 20 finds its most effective use in circuits that can accommodate significant changes in the approximate gain expression of $R_C/R_E$. In applications that demand a more stable and accurate gain, the differential gain can be accurately set by the use of negative feedback, e.g., by the addition of feedback resistors 36 and 38 as shown in broken lines in the differential amplifier 40 of FIG. 1B. However, negative feedback generally requires the addition of frequency compensation circuits to achieve closed-loop stability. As a result, the amplifier's gain bandwidth is reduced. Therefore, closed-loop amplifiers are not an attractive option in circuits that operate at the highest attainable speed.

An example of such a circuit is a residue amplifier that is typically used in subranging analog-to-digital (A/D) converters. These converters are among the fastest of all A/D converters and are used in a variety of high-speed data acquisition systems, e.g., television video digitizing, medical imaging and radar detection. The residue amplifier responds to the difference between the converter's analog input and the output of a coarse-bit quantizer wherein the quantizer output is first modified by a reconstruction D/A converter. The amplified difference is fed to a fine-bit quantizer and the output of both quantizers is combined to form the A/D converter's digital code.

A large bandwidth in the residue amplifier is essential for realizing superior A/D resolution and high conversion speed. At the same time, stable and accurate gain of the residue amplifier is required to avoid conversion errors due to mismatching between the difference signal range and the range of the fine-bit quantizer.

Exemplary subranging A/D converters are described in the following references: William T. Colleran et al., "A 10-b, 75 MHz Two-Stage Pipelined Bipolar A/D Converter", *IEEE Journal of Solid-State Circuits*, Vol. 28, No. 12, December, 1993, pp. 1187–1199 and Takahiro Miki, et al., "A 10-b, 50 MS/s, 500-mW A/D Converter Using a Differential-Voltage Subconverter", *IEEE Journal of Solid-State Circuits*, Vol. 29, No. 4, April, 1994, pp. 516–521. No attempt has been made in the former reference to stabilize the gain of its residue amplifier. In the latter reference, on-chip replica circuits are used with external control amplifiers to force a match between the difference signal range and the range of the fine-bit quantizer.

An exemplary differential subtractor (residue amplifier) for use in a two-step parallel A/D converter (subranging A/D converter) is described in U.S. Pat. No. 5,313,207. This subtractor is arranged to limit the difference in emitter currents of a differential pair and to maintain substantially equal base-emitter voltages in the differential pair. However, this structure is still vulnerable to the gain-modifying effects discussed above.

SUMMARY OF THE INVENTION

The present invention is directed to open-loop differential amplifier structures that have accurate and stable gain. This goal is realized with input and output differential amplifiers whose combined gain G is set by a ratio of resistor values. Gain errors due to transistor parameters are corrected by compensating signals which are developed in response to the amplifier's output signals. In particular, these signals cause amplifiers in accordance with the invention to be substantially insensitive to $r_e$, $\beta$ and $V_A$. As the gain is essentially set by resistor ratios, the teachings of the invention will be particularly advantageous for amplifiers built with an integrated circuit process.

Differential amplifiers in accordance with the invention are characterized by gain compensating signals which are fed back to an input differential pair from a coupled output differential pair. Generation of these signals is facilitated by the addition of cross-coupling paths between the collectors (drains) and bases (gates) of the output differential pair. The amplitudes of these compensating signals are set by selecting appropriate ratios of the current sources, emitter (source) resistors and collector (drain) resistors of the two differential pairs. The collector (drain) resistors of the output differential pair are preferably positioned in the collectors (drains) of emitter (source) followers which couple signals from the input differential pair to the amplifier output.

Specifically, the resistor and current values in the input differential pair are multiplied respectively by N and 1/N when selecting their respective values in the output differential pair. Setting N substantially equal to the amplifier's gain G is especially effective in reducing sensitivity to the current gain β and the Early effect.

In one embodiment, the input differential pair is adapted to form a second input port for receiving differential currents. This embodiment is especially suited for applications in which it is desired to produce a differential output voltage with a gain relative to the difference in a differential input voltage and a differential input current, e.g., as a residue amplifier in a subranging A/D converter.

In low gain (e.g., <10) embodiments of the invention, the sensitivity to the Early effect can be further reduced by modifying the value of N when selecting collector resistors in the output differential pair. In these embodiments, N is preferably set to G+1 or G+2 when the amplifier input signal of primary interest is respectively a current or a voltage.

In one embodiment, each of the cross-coupling paths in the output differential amplifier includes a path portion through a respective one of buffer transistors. In another embodiment, each of the cross-coupling paths includes a path portion through a respective one of the coupling transistors.

The novel features of the invention are set forth with particularity in the appended claims. The invention will be best understood from the following description when read in conjunction with the accompanying drawings.

BRIEF DESCRIPTION OF THE DRAWINGS

FIG. 2 is a schematic of an open-loop differential amplifier in accordance with the present invention;

FIG. 3 is a schematic of a small-signal transistor model;

FIG. 4 is a schematic that is derived by substitution of the small-signal model of FIG. 3 for transistors in an output portion of FIG. 2;

FIG. 11 is a block diagram of a subranging A/D converter;

FIG. 12 is a graph showing the response of the residue amplifier in the converter of FIG. 11 to the converter's input;

DESCRIPTION OF THE PREFERRED EMBODIMENTS

FIG. 2 is a schematic of a differential amplifier 60 in accordance with the present invention. The amplifier 60 has an open-loop gain which is substantially insensitive to changes in the small signal emitter resistance $r_e$. This insensitivity becomes apparent when the amplifier's gain is analyzed with the aid of a transistor small-signal model.

Figure 1B:
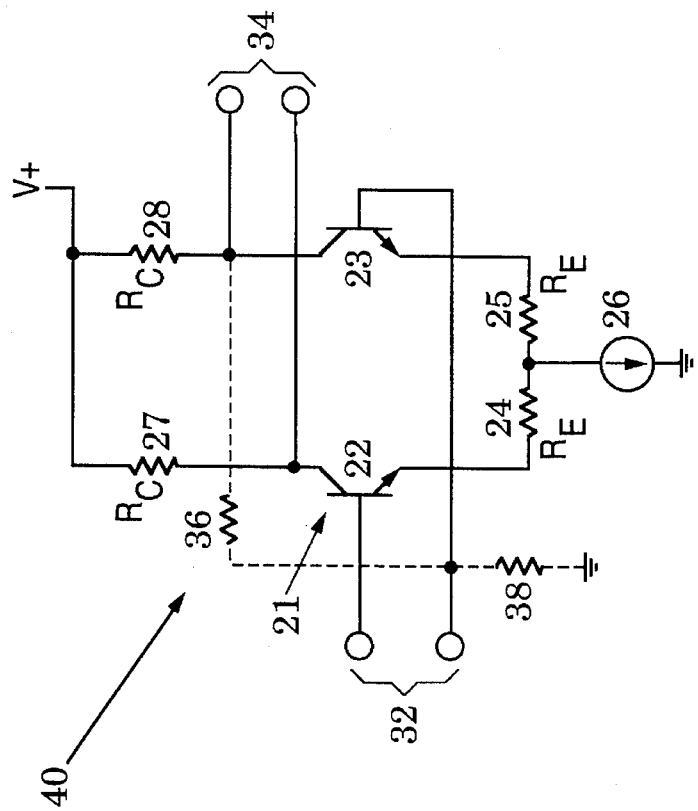
FIG. 1B is a schematic of the differential amplifier of FIG. 1A with its gain stabilized by negative feedback.
Figure 1A:
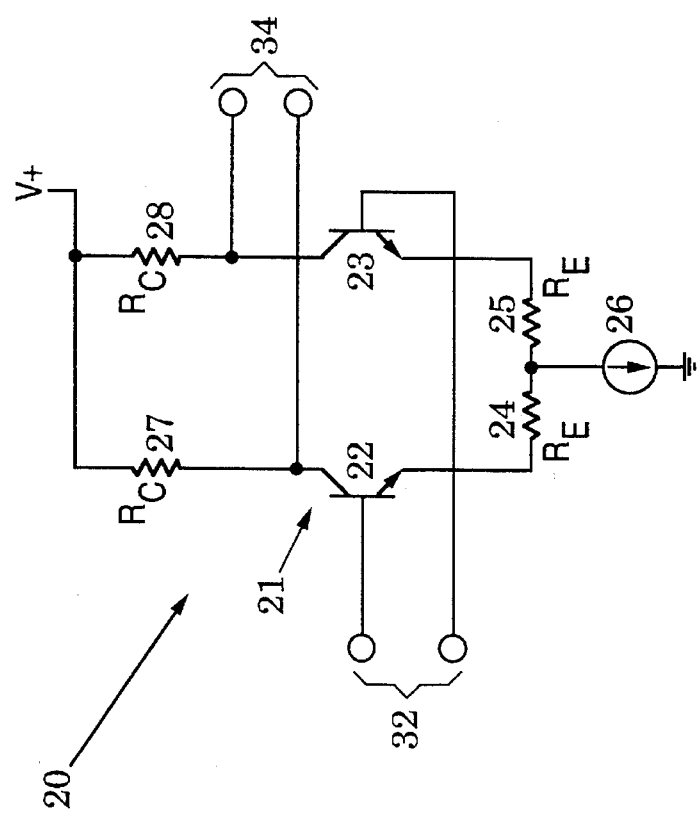
FIG. 1A is a schematic of a prior art differential amplifier.

Attention is first directed to the structure of the amplifier 60. It has an input differential amplifier 62 which drives an output differential amplifier 64. The division between these amplifiers is indicated by a broken partition line 65. The input amplifier 62 is similar to the differential amplifier 20 of FIG. 1A with like elements indicated by like reference numbers.

The output amplifier 64 has a differential pair 67 of transistors 68 and 69. The emitters of the differential pair are coupled respectively through source resistors 70 and 71 to a current source 72. The collectors of these transistors are coupled to a supply voltage V+ by emitter follower transistors 74 and 75. The bases of these emitter follower transistors are coupled respectively to the collectors of transistors 23 and 22. Leads from the emitters of the emitter followers form a differential output port 80. In operation, transistors 74 and 75 are coupling transistors that couple the differential signal at the load resistors 27 and 28 of the input differential pair 21 to the output port 80.

The collector of each of the transistors of the differential pair 67 is coupled along a respective coupling path to the base of the other transistor of the differential pair. This cross-coupling is accomplished through the high input impedance of buffer transistors in the form of emitter follower transistors 82 and 84 whose emitters are connected respectively to current sources 86 and 88. In this amplifier embodiment, the coupling path between the collector of each of the transistors of the differential pair 67 to the base of the other transistor of the differential pair includes a path portion through a respective buffer transistor. The current sources 26 and 72 each have the same current value of $I_S$ and the resistors 24, 25, 70 and 71 have the same resistance value of $R_E$.

The open-loop gain of the differential amplifier 60 can be analyzed with the aid of the small-signal, bipolar junction transistor model 96 shown in FIG. 3. The model 96 has an emitter resistor $r_e$ between its base and emitter terminals b and e. The emitter resistance is given by $r_e=V_T/i_e$ in which $V_T$ is the thermal voltage of approximately 26 millivolts and $i_e$ is the emitter current. A current source $\alpha i_e$ is positioned between the base and collector terminals b and c ($\alpha$ is the ratio of collector current to emitter current). The common base, output resistance $r_c$, which is in parallel with the current source $\alpha i_e$, is the small-signal resistance from collector to base with a constant emitter current. It can generally be ignored because its value is typically several megohms. Small-signal amplifier models and analysis have been developed by numerous authors, e.g., Bogart, Theodore, Jr.,

*Electronic Devices and Circuits*, Macmillan Publishing Company, New York, 1993.

With the small signal model of FIG. 3, it is easily shown (for example, see the abovementioned reference) that the differential gain of the input amplifier 62 is $$G_{62} = \frac{R_C}{r_{e_{62}} + R_E}$$

in which $r_{e_{62}}$ is the emitter resistance of either of the transistors 22 and 23. The transistors have the same emitter resistance value because they both have an emitter current of $I_S/2$.

The differential amplifier 64 is symmetrical and, therefore, its gain can be determined by analyzing one side of the amplifier. Accordingly, the model 96 of FIG. 3 is substituted for the transistors 74 and 68 to obtain the equivalent circuit 100 of FIG. 4 in which elements belonging to the transistors 74 and 68 are indicated by appropriate subscripts. In deriving this circuit, it is assumed that the emitter follower 82 can be ignored and that the inverting side of the output port 80 is directly coupled to the base of the transistor 68. It is further assumed that the circuit node between resistors 70 and 71 is a virtual ground for differential signals because the emitter currents of the transistor pair 67 must always sum to $I_S$ and a change in one of the emitter currents causes an opposite and equal change in the other emitter current. The intermediate input signal $V_{int}$ at the base of transistor 74 is the output from the collector of transistor 23 of the input amplifier 62.

It is apparent that the current through the emitter resistor $r_{e_{68}}$ is given by $$i_{e_{68}} = \frac{-V_o}{r_{e_{68}} + R_E}.$$

Since this same current flows through $r_{e_{74}}$, the difference between $V_{int}$ and $V_o$ is $$V_{int} - V_o = \frac{-V_o r_{e_{74}}}{r_{e_{68}} + R_E}.$$

Solving this equation for $V_o/V_{int}$ yields the expression of $$\frac{V_o}{V_{int}} = \frac{r_{e_{68}} + R_E}{r_{e_{68}} - r_{e_{74}} + R_E}.$$

Because of symmetry, this is also the differential gain of the output amplifier 64. The gain of the differential amplifier 60 is the product of the gains of the input amplifier 62 and the output amplifier 64. Therefore, the gain from the input port 32 to the output port 80 in FIG. 2 is $$G_{60} = \left(\frac{R_C}{r_{e_{62}} + R_E}\right)\left(\frac{r_{e_{68}} + R_E}{r_{e_{68}} - r_{e_{74}} + R_E}\right).$$

The emitter currents of transistors 68 and 74 are both equal to $I_S/2$. Therefore, their emitter resistances $r_{e_{68}}$ and $r_{e_{74}}$ equal the emitter resistance $r_{e_{62}}$. Accordingly, the gain expression for G60 reduces to the resistor ratio of $R_C/R_E$. The gain of the differential amplifier 60 is thus substantially insensitive to changes in emitter resistance $r_e$ that will be caused by variations in operating conditions, e.g., temperature and bias current.

Because its gain is set by a ratio of the $R_C$ and $R_E$ resistors, the amplifier 60 is particularly suited for use in integrated circuits. Although the sheet resistance p of integrated circuits may vary from wafer to wafer, photolithographic layout procedures cause resistance ratios on each chip to be held to a high precision. The magnitude of the current produced by integrated circuit current sources typically varies inversely with changes in sheet resistance but the relationship between current sources is precisely held. Thus, the gain of the amplifier 60 will be closely held across production lots.

The differential amplifier 60 requires that the current sources 26 and 72 are matched in current. This requirement is relaxed in the differential amplifier 120 of FIG. 5. The amplifier 120 is similar to the amplifier 60 of FIG. 2 with like elements indicated by like reference numbers. However, the amplifier 120 has an output amplifier 124 with a current source 126 whose current is $I_S/N$. Because the emitter resistors $r_e$ vary inversely with emitter current, the terms $r_e$ in the expression above for $V_o/V_{int}$ increase to $Nr_e$. The resistance of the resistors 128 and 130, which are coupled to the current source 126, is $NR_E$. This changes the terms $R_E$ in the expression for $V_o/V_{int}$ to $NR_E$. Canceling N from numerator and denominator yields a gain of the output amplifier 124 that is the same as that of the output amplifier 64 of FIG. 2.

Figure 5:
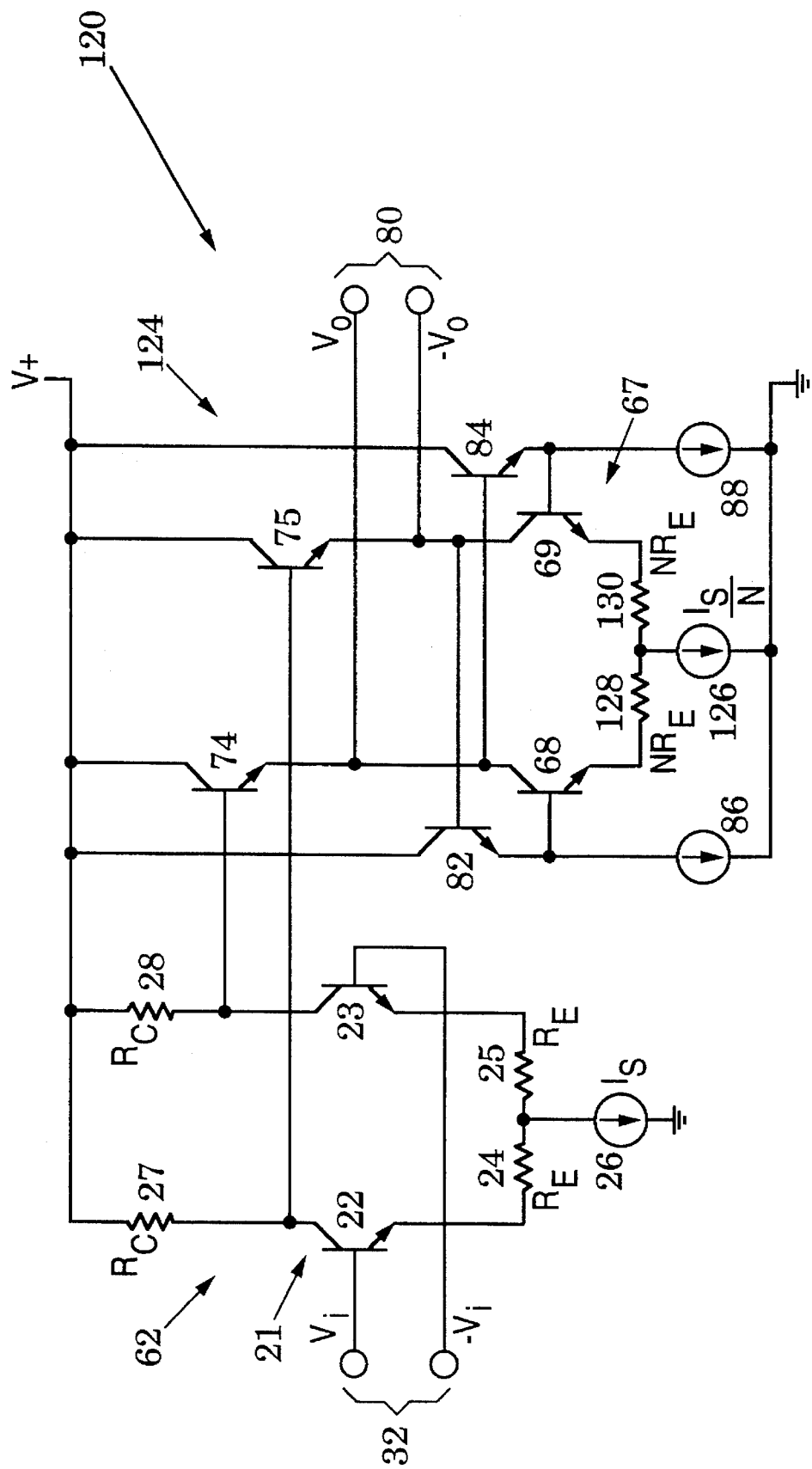
FIG. 5 is a schematic of another open-loop differential amplifier in accordance with the present invention.
Figure 7:
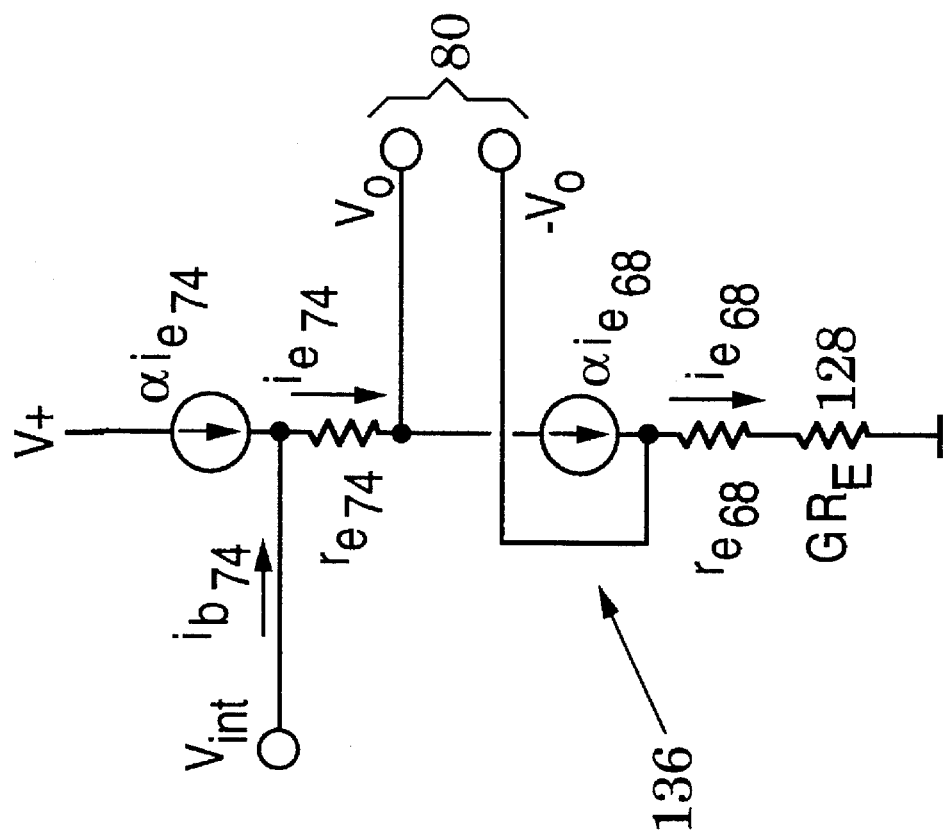
FIG. 7 is a schematic that is derived by substitution of the small-signal model of FIG. 3 for transistors in an output portion of FIG. 5.
Figure 6:
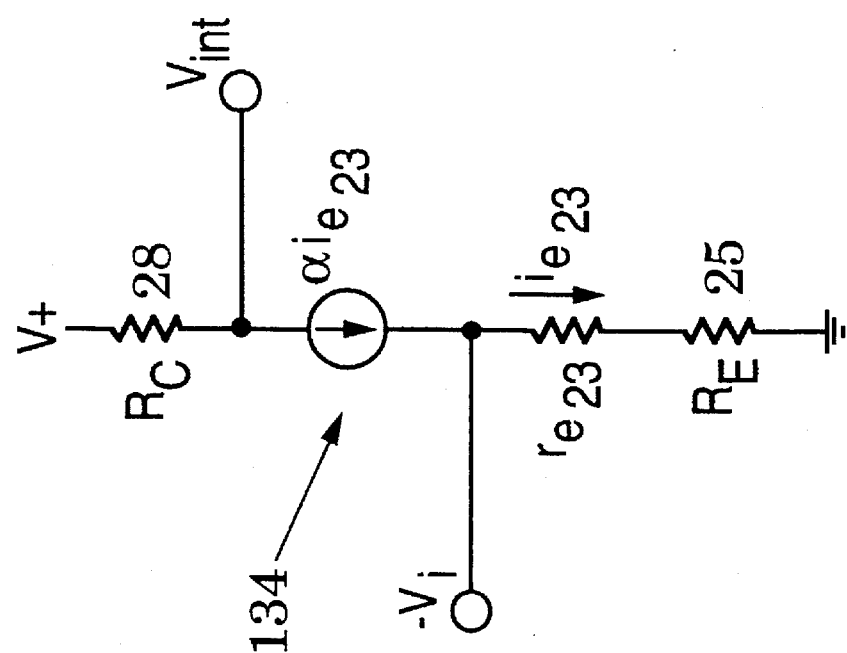
FIG. 6 is a schematic that is derived by substitution of the small-signal model of FIG. 3 for a transistor in an input portion of FIG. 5.

If N in FIG. 5 is set to the nominal gain G ($R_C/R_E$) of the amplifier 120, the amplifier's gain is also stabilized with respect to current gain β. This substitution causes the emitter resistors 128 and 130 to have a resistance of $GR_E$ and the current source 126 to have a current of $I_S/G$. As a result, the collector current flow is corrected in transistors 22 and 23 where the output voltage of the amplifier 120 is developed across the load resistors 27 and 28. This correction can be analyzed with the aid of circuits 134 and 136 of FIGS. 6 and 7. The circuit 134 is formed by substitution of the small-signal model 96 of FIG. 3 for transistor 23 and the circuit 136 is formed by substitution of the model 96 for transistors 74 and 68. In accordance with the change of N to G, the resistor 128 in FIG. 7 now has the value of $GR_E$. The connection between transistors 23 and 74 in FIG. 5 is indicated by the intermediate terminal $V_{int}$ in FIGS. 6 and 7.

The circuit 134 shows that $i_{c23} = \alpha i_{e23}$ and that $i_{e23} = -V_i/(r_{e23} + R_E)$. Accordingly, the collector current of the transistor 23 is $$i_{c23} = \alpha \left(\frac{-V_i}{r_{e23} + R_E}\right).$$

The intermediate signal $V_{int}$ is developed by the flow of current through the load resistor 28. For a given input signal $V_i$, this equation shows that $V_{int}$ is sensitive to variations in α. The difference between emitter current and collector current in the transistor 23 can be considered to be an error current $i_{err}$ through the resistor 28. With the use of the expression above for collector current, this error current of $i_{e23}$ less $i_{c23}$ is given by $$i_{err} = (1 - \alpha)\left(\frac{-V_i}{r_{e23} + R_E}\right).$$

In the circuit 136, this error term is corrected by the base current of the transistor 74 which flows through the load resistor 28 of the circuit 134. This may be shown by developing an expression for $i_{b74}$. From FIG. 7, the base current of transistor 74 is $i_{b74} = (1-\alpha)i_{e74}$. The emitter current of transistor 74 is the same as the emitter current of transistor 68 which is $-V_o/(r_{e68} + GR_E)$. Combining these relationships yields $$i_{b_{74}} = (1-\alpha)\left(\frac{-V_o}{r_{e_{68}} + GR_E}\right)$$

as the base current of transistor 74. Because the emitter current of transistor 23 is larger than the emitter current of transistor 68 by the factor G, their internal emitter resistors are related by $r_{e68}=Gr_{e23}$ and the base current of transistor 74 can be expressed as $$i_{b_{74}} = (1-\alpha)\left(\frac{-V_o}{Gr_{e_{23}} + GR_E}\right).$$

The gain G is $V_o/V_i$ and with this substitution, the base current of transistor 74 becomes $$i_{b_{74}} = (1-\alpha)\left(\frac{-V_i}{r_{e_{23}} + R_E}\right).$$

Therefore, the base current of transistor 74 supplies the error term to stabilize the gain in the collector of transistor 23. In a similar manner, the base current of transistor 75 supplies an error term to stabilize the gain in the collector of transistor 22. Therefore, setting N equal to the nominal gain G has substantially stabilized the gain of the amplifier 120 with respect to α. Equivalently, the gain is substantially stabilized with respect to β since β=α/(1−α).

Figure 8:
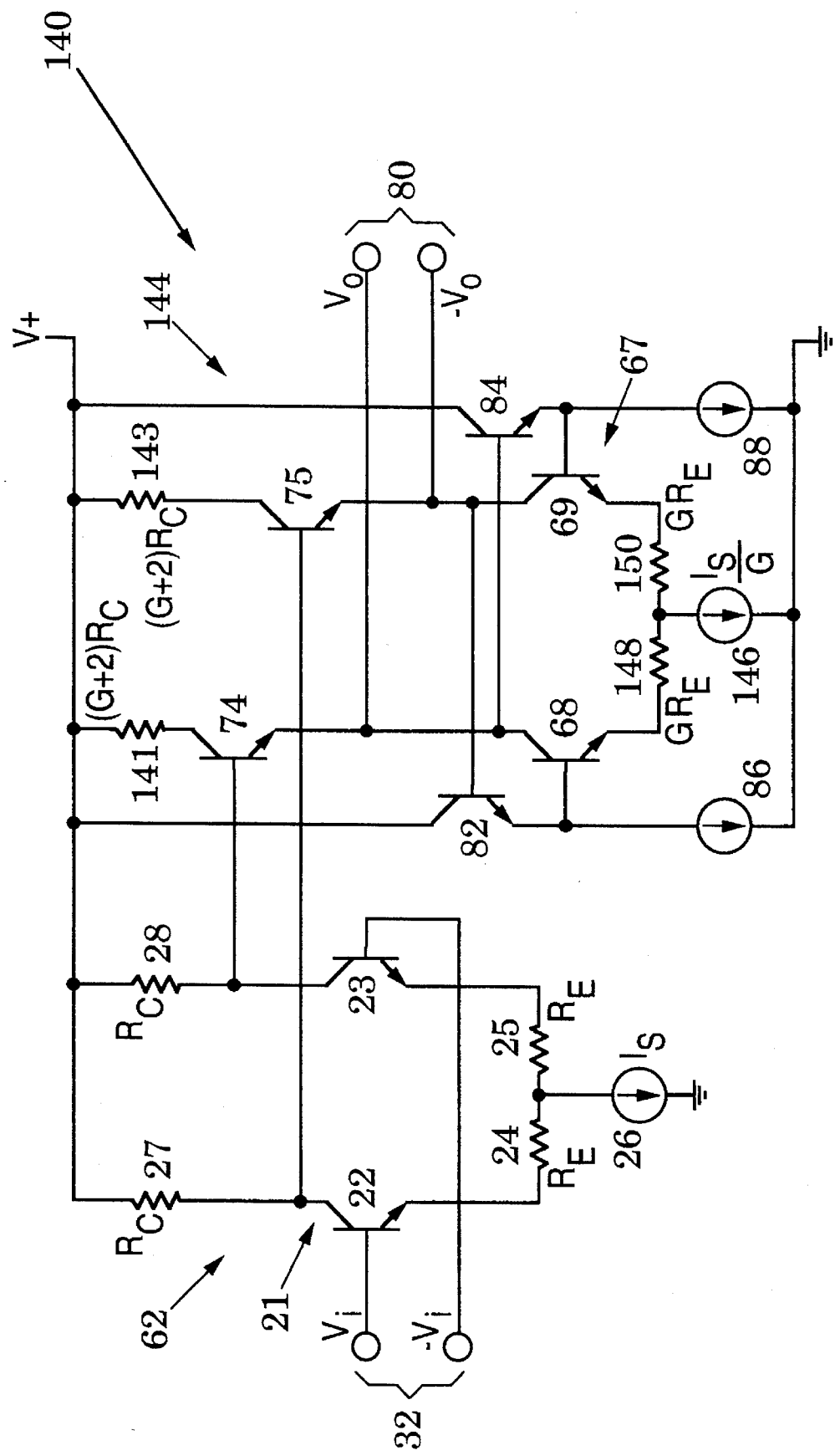
FIG. 8 is a schematic of another open-loop differential amplifier in accordance with the present invention.

FIG. 8 illustrates another differential amplifier embodiment 140 which is similar to the amplifier 120 of FIG. 5 with like elements indicated by like reference numbers. However, the amplifier 140 has an output amplifier 144 which includes resistors 141 and 143 that are inserted respectively into the collectors of the emitter followers 74 and 75. The resistance of these resistors is set at $(G+2)R_C$ and the differential pair 67 is coupled to a current source 146 that has a current of $I_S/G$. The differential pair 67 is connected to this current source through source resistors 148, 150 whose resistance is set at $GR_E$. The addition of the load resistors 141 and 143 substantially stabilizes the gain of the amplifier 140 with respect to effects of the Early voltage $V_A$.

Figure 9:
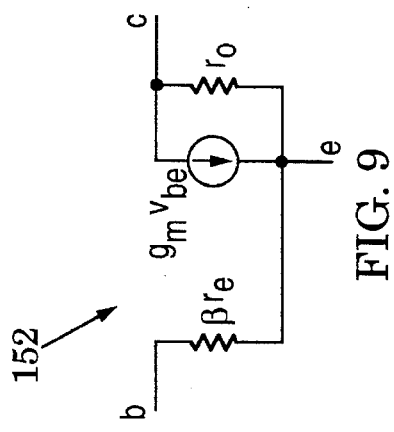
FIG. 9 is a schematic of a transconductance small-signal transistor model.

This stabilization may be understood with the help of the transconductance transistor model 152 of FIG. 9. In this commonly used model (e.g., see Bogart), a common emitter output resistor $r_o$ connects the collector and emitter terminals. In high quality transistors, its resistance is approximately equal to the ratio of the Early voltage and the collector current. A current source $g_m v_{be}$ is positioned between the collector and emitter terminals. It represents an output current which responds to an input voltage between the base and emitter terminals.

Figure 10:
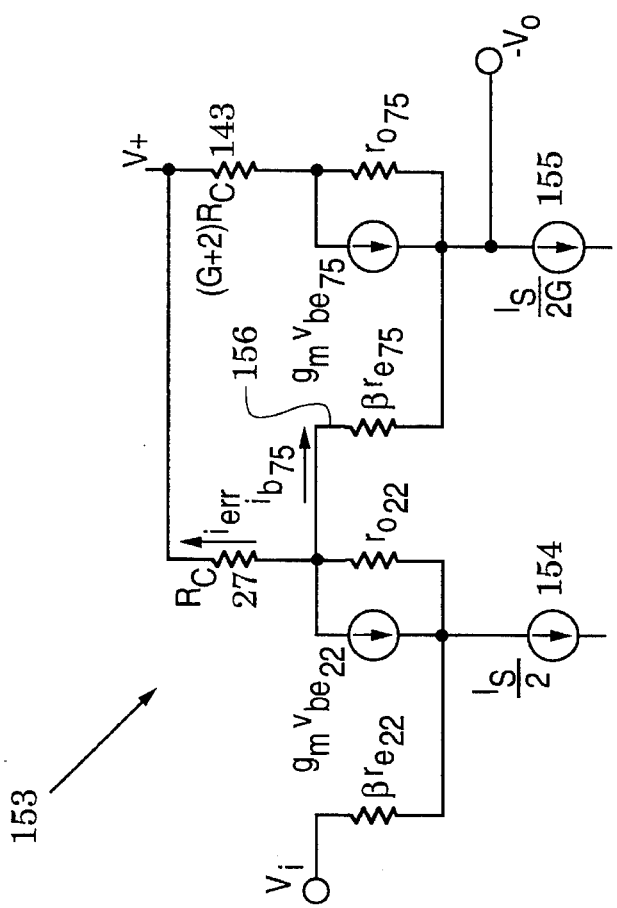
FIG. 10 is a schematic that is derived by substitution of the small-signal model of FIG. 9 for transistors in input and output portions of FIG. 8.

The circuit 153 of FIG. 10 is obtained by substituting the model 152 for the transistors 22 and 75 of FIG. 8 as indicated by element subscripts. In FIG. 10, the current of $g_m v_{be22}$ develops an output voltage across the load resistor 27 that is proportional to the input voltage $V_i$. Because $r_{o22}$ is finite, there is also an error current through resistor 27 of $i_{err} = \Delta V_{CE22}/r_{o22}$ which alters the proportionality between output and input voltages. This error term can be substantially canceled if the base current $i_{b75}$ is of the same magnitude since it also flows through the load resistor 27.

The current sources 154 and 155 are substituted into FIG. 10 to indicate that transistors 22 and 75 receive ½ of the current of their respective current sources 26 and 146. Because these currents differ by G, $r_{o75}$ is approximately $Gr_{o22}$ so that the base current $i_{b75}$ would equal $i_{err}$ if $\Delta V_{CE75} = G\Delta V_{CE22}$.

The emitter voltage of transistor 22 essentially follows the input signal $V_i$ and the collector voltage of transistor 22 moves in accordance with the product $GV_i$. These voltages move oppositely so that $\Delta V_{CE22} = V_i(1+G)$. The emitter voltage of transistor 75 follows its base voltage (collector voltage of transistor 22) of $GV_i$ and the collector voltage of transistor 75 moves in accordance with $G_2 GV_i$ in which $G_2 = R143/R150$ (see FIG. 8).

However, the cross-coupling between the collectors and bases of the output differential pair (68, 69 in FIG. 8) causes the collector and emitter voltages of the transistor 75 to move up and down together. This can be observed in FIG. 8 by assuming that the base and emitter of transistor 75 has moved downward. In this case, the action of the input differential pair 21 would cause the base and emitter of transistor 74 to move upward. Because of cross-coupling, the base and emitter of transistor 69 also move upward to, thereby, increase the collector currents of transistors 69 and 75 and decrease the collector voltage of transistor 75. Therefore, the movement of the emitter of transistor 74 subtracts from the movement of its collector and $\Delta V_{CE22} = G_2 GV_i - GV_i = GV_i(G_2 - 1)$. This latter term will equal $G\Delta V_{CE22}$ if $GV_i(G_2-1) = GV_i(1+G)$ which is true if $G_2 = G+2$. From $G = R_C/R_E$ we have $GR_E = R_C$ so that the resistance of the resistor 150 also equals $R_C$. Thus, $G_2$ will equal G+2 if the resistance of the resistor 143 is $(G+2)R_C$. Setting resistor 143 to this value will cause the base current $i_{b75}$ to substantially cancel the error current $i_{err}$.

Embodiments of the differential amplifier 140 can be advantageously used in a variety of systems that require amplifier gain accuracy and stability in combination with large bandwidth. For example, the system of FIG. 11 illustrates a typical subranging A/D converter 160 which includes a residue amplifier 162 whose gain accuracy and stability directly affect the linearity and code fidelity of the converter and whose bandwidth directly affects the converter's conversion speed. These residue amplifier parameters are enhanced by the use of an open-loop differential amplifier in accordance with the present invention.

Flash A/D converters produce an N-bit digital code in a single, parallel comparison step. They are extremely fast because they couple the analog input simultaneously to 2N-1 comparators. Alternatively, the subranging A/D converter 160 combines coarse-bit and fine-bit quantizers by the use of a residue amplifier and a reconstruction D/A converter to significantly reduce the comparator count of a flash converter with only a small decrease in speed. For example, an eight bit A/D converter requires 255 comparators if realized as a flash converter and 30 comparators if realized as a subranging converter with four bit coarse and fine quantizers.

For descriptive purposes, the subranging converter 160 of FIG. 11 is illustrated as an eight bit converter. In this converter, analog input signals at a converter input port 163 are coupled through a track and hold circuit 164 to a coarse-bit quantizer 166 and the residue amplifier 162. The digital output of the coarse-bit quantizer 166 is converted by a D/A converter 168 to an analog signal at its output 170. In the residue amplifier 162, this signal is subtracted from the held analog signal at the output 171 of the track and hold 164 to form a residue signal. The residue signal is applied to the fine-bit quantizer 172. The combined outputs of the two quantizers forms a single, eight bit binary word.

To illustrate the operation of the converter 160, assume that an analog signal at the input 163 is ramped linearly upwards over the input range of the converter 160. The output of the residue amplifier 162 should present this same signal to the fine-bit quantizer 172 until the output code of the coarse-bit quantizer 166 changes from 0000 to 0001. The output of the residue amplifier 162 during this initial period of the analog input is illustrated as the ramp signal 174 in FIG. 12.

At the end of this period, an analog signal is produced at the reconstruction D/A converter's output 170 in response to the code change of the coarse-bit quantizer 166. This signal is subtracted from the output of the track and hold 164 by the residue amplifier 162 and its amplitude is sufficient to reset the output of the residue amplifier to the bottom of the fine-bit quantizer's input range. This reset is indicated by the vertical reset line 176 in FIG. 12. During this initial period, the amplitude of the ramp 174 should match the analog input range 178 of the fine-bit quantizer as shown in FIG. 12.

This process continues through the increasing amplitude of the analog signal at the converter input 163. The output of the reconstruction D/A converter 168 increases with each code change of the coarse-bit quantizer 166 so that the output of the residue amplifier 162 is continually reset to the bottom of the fine-bit quantizer's range at each code change of the coarse-bit quantizer 166. In a final period of the input analog signal, the output of the residue amplifier 162 ramps over the input range of the fine-bit quantizer as indicated by the ramp signal 180. At the end of this ramp signal, the output code of the coarse-bit quantizer changes from 1110 to 1111. The output of the fine-bit quantizer 172 fills in the last four bits of code between each code change of the coarse-bit quantizer. The names residue and reconstruction are derived from the functions performed by the amplifier 162 and D/A converter 168 in the subranging converter 160.

Obviously, conversion errors result if the residue amplifier output range does not match the input range 178 of the fine-bit quantizer 172 (see FIG. 12). Small mismatches cause the subranging converter's linearity to be degraded. Larger mismatches will cause errors in the converter's code. The input range of the fine-bit quantizer 172 is typically selected to optimize its design and performance and the gain of the residue amplifier 162 is adjusted accordingly.

The reconstruction D/A converter 168 is typically structured as a series of switched current sources. In this D/A converter realization, the output 170 is a differential current signal. Accordingly, the differential amplifier 140 of FIG. 8 is adapted to form the amplifier 190 of FIG. 13. The amplifier 190 is similar to the amplifier 140 with like elements indicated by like reference numbers. However, the amplifier 190 has an input amplifier 192 that includes a differential current input port 194. The port 194 is coupled to the emitters of transistors 22 and 23 with a resistance of $2R_E$ (resistors 24 and 25) connected across the port. When used as a residue amplifier, the input port 194 receives a differential current signal $I_{DAC}$ from the output 170 of the reconstruction D/A converter 168 of FIG. 11 and the input port 32 receives a differential voltage signal from the track and hold output 171.

The amplitude of the differential current of the reconstruction D/A converter 168 is termed a full-scale D/A current IFS. In operation as a residue amplifier, the amplitude of $I_{DAC}$ in FIG. 13 varies from zero to $I_{FS}$. When the input signal to the subranging A/D converter 160 of FIG. 11 is at the bottom of the converter's input range (beginning of ramp voltage 174 in FIG. 12), $I_{FS}$ will flow in the upper side 196 of the port 194. At this time, the current in the lower side 198 of the port 194 will be zero. These currents change in opposite steps in response to code changes of the coarse-bit quantizer 166 until the current in the upper side 196 is zero when the converter's input voltage is at the top of its range (end of ramp 180 in FIG. 12). At this time, the current in the lower side 198 has increased to $I_{FS}$.

Because these currents are repetitively offsetting the increasing analog signal at the input port 32 (the track and hold output 171), the emitter current variation in transistors 22 and 23 is limited to $I_{FS}$ divided by $2^N-1$ where N is the number of bits in the subranging converter's coarse-bit quantizer. To maintain equal internal emitter resistors $r_e$ throughout the amplifier 190, the current of the current source 146 in the outpost amplifier is set to $I_{FS}/G$.

The output amplifier 210 of the amplifier 190 also differs from the output amplifier 144 of the amplifier 140 in FIG. 8. The difference consists of replacing the collector resistors 141 and 143 with the resistors 211 and 213 which have resistances of $(G+1)R_C$. This resistance value is modified (from the value of $(G+2)R_C$) when the primary consideration is amplifier gain from the current input port 194 to the output port 80.

This can be shown by reference to the earlier analysis in which the amplitude of the base current $i_{b75}$ was arranged to cancel the error current $i_{err}$ in FIG. 10. From the viewpoint of the current input port 194, the collector voltage $\Delta V_{CE22}$ is determined by the product of $I_{DAC}R_C$. The emitter voltage of transistor 75 is now $I_{DAC}R_C$ and its collector voltage is $G_3I_{DAC}R_C$ in which $G_3=R213/R150$ (see FIG. 13). Therefore, $\Delta V_{CE22}=G_3I_{DAC}R_C-I_{DAC}R_C$. This latter term will equal $G\Delta V_{CE22}$ if $G_3I_{DAC}R_C-I_{DAC}R_C=GI_{DAC}R_C$ which is true if $G_3=G+1$. From the earlier analysis, it follows that the error current $i_{err}$ will be substantially cancelled by the base current $i_{b75}$ if the resistance of the resistor R213 is $(G+1)R_C$.

Figure 13:
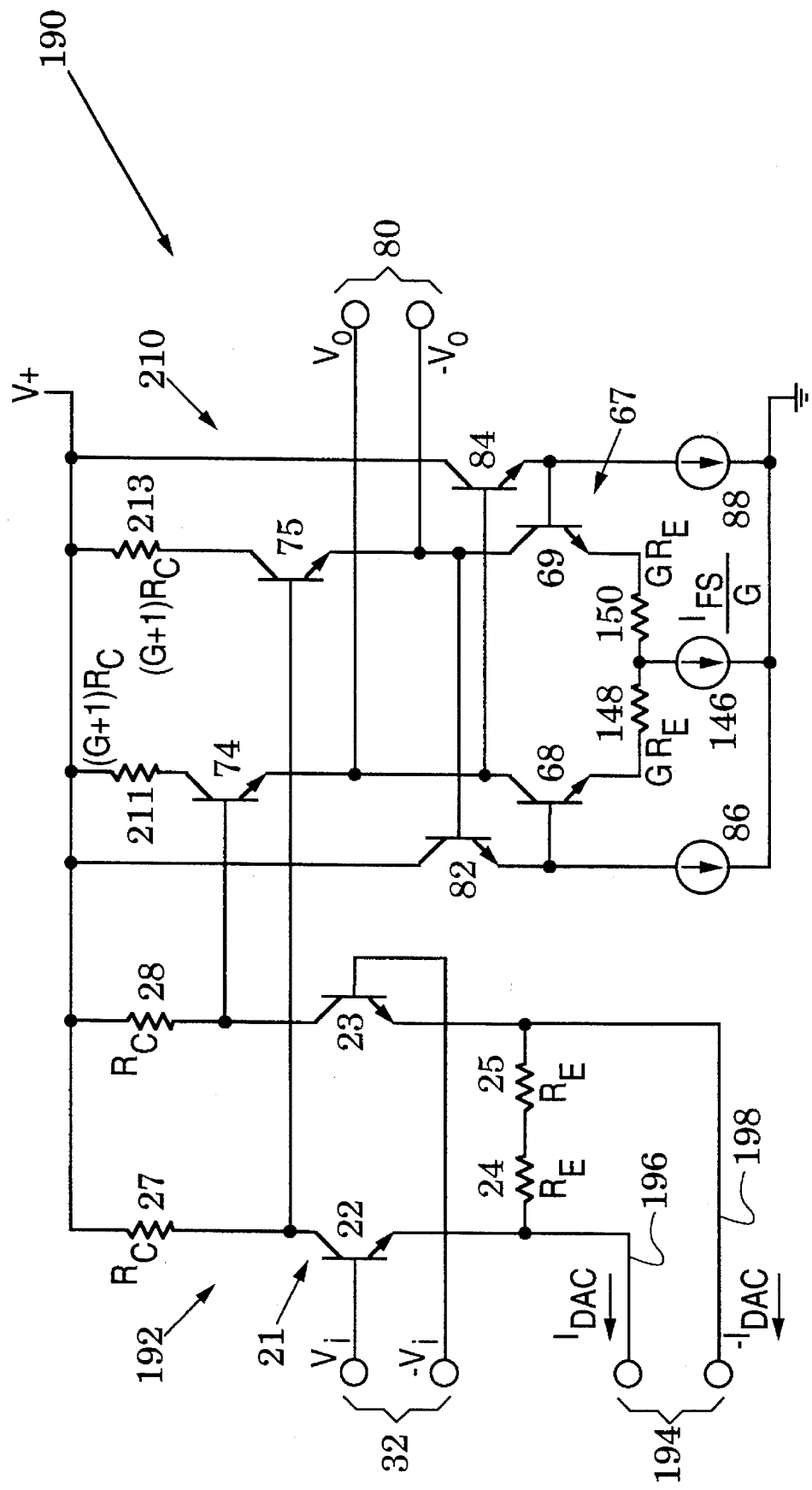
FIG. 13 is a schematic of the differential amplifier of FIG. 8 after it is adapted for use as the residue amplifier in the converter of FIG. 11.

In comparing the resistance value $(G+2)R_C$ of the resistors 141 and 143 in the amplifier 140 of FIG. 8 with the resistance value $(G+1)R_C$ of the resistors 211 and 213 in the amplifier 190 of FIG. 13, it may be observed that for large values of amplifier gain G, substantial cancellation of the Early effect is obtained with collector resistor values of $GR_C$ in both of the structures of FIGS. 8 and 13 (because if G is large, G+1 and G+2 are approximately G). However, for small values of amplifier gain, e.g., <10, a more complete cancellation is obtained with resistor values of $(G+2)R_C$ if the principal concern is amplifier gain from the voltage input port 32 to the output port 80 and with resistor values of $(G+1)R_C$ if the principal concern is amplifier gain from the current input port 194 to the output port 80.

In the amplifier 190 of FIG. 13, gain stabilization correction currents are fed back to the input differential amplifier 192 from the output differential amplifier 144. This is advantageous for use as a residue amplifier because of the relatively large signal range at the input port 32. The signal range at the output port 80 is greatly reduced because the signal at the input port 32 is mostly offset by the differential current at the input port 194. In this structure, it is typically difficult to use gain stabilization techniques that are based upon use of the much larger input signals.

An exemplary eight bit subranging A/D converter design incorporates the differential amplifier 190 of FIG. 13 as the residue amplifier 162 of FIG. 11. The design is intended to operate from a 5 volt power supply and have an analog input range (at the converter input 163) of 1.024 volts. The coarse-bit and fine-bit quantizers 166 and 172 each produce a four-bit code. The input signal range between code changes of the coarse-bit quantizer 166 is $1.024/2^4=64$ millivolts. The range between code changes of the fine-bit quantizer 172 (i.e., the converter's LSB) is $64/2^4=4$ millivolts.

The gain of the residue amplifier 162 is selected to be four so that the input range of the fine-bit quantizer 172 will be $(64)4=256$ millivolts. This gain is obtained by setting $R_C$ and $R_E$ in FIG. 13 to 1K ohms and 250 ohms respectively.

Therefore, resistors 148 and 150 each have a resistance of (4)250=1K ohms. Each coarse-bit quantizer code change must cause a reset at the fine-bit quantizer's input of 256 millivolts (e.g., the vertical reset line 176 in FIG. 12). Each reset is realized across the 1K ohm resistances of the load resistors 27 and 28 by a differential current shift of 256 microamperes; i.e., a drop of 128 microamperes in one of the load resistors and a rise of 128 microamperes in the other. Over the input range of the converter, this reset occurs 15 ($2^4$–1) times for a total current shift of 1.92 milliamperes.

At the bottom of the converter's input range, 1.92 milliamperes flows in the upper arm 196 of the input port 194 and zero current is in the other arm 198. Conversely, at the upper limit of the converter's input zero current flows in the arm 192 and 1.92 milliamperes flows in the arm 198. Therefore, in this design $I_{FS}$=1.92 milliamperes. As the converter input signal ramps between each code change of the coarse-bit quantizer 172, an emitter current of 128 microamperes is transferred between the emitters of transistors 22 and 23. At the mid-range of each code change, the emitters each carry a current of 1.92÷2=960 microamperes ($I_{FS}/2$).

Figure 14:
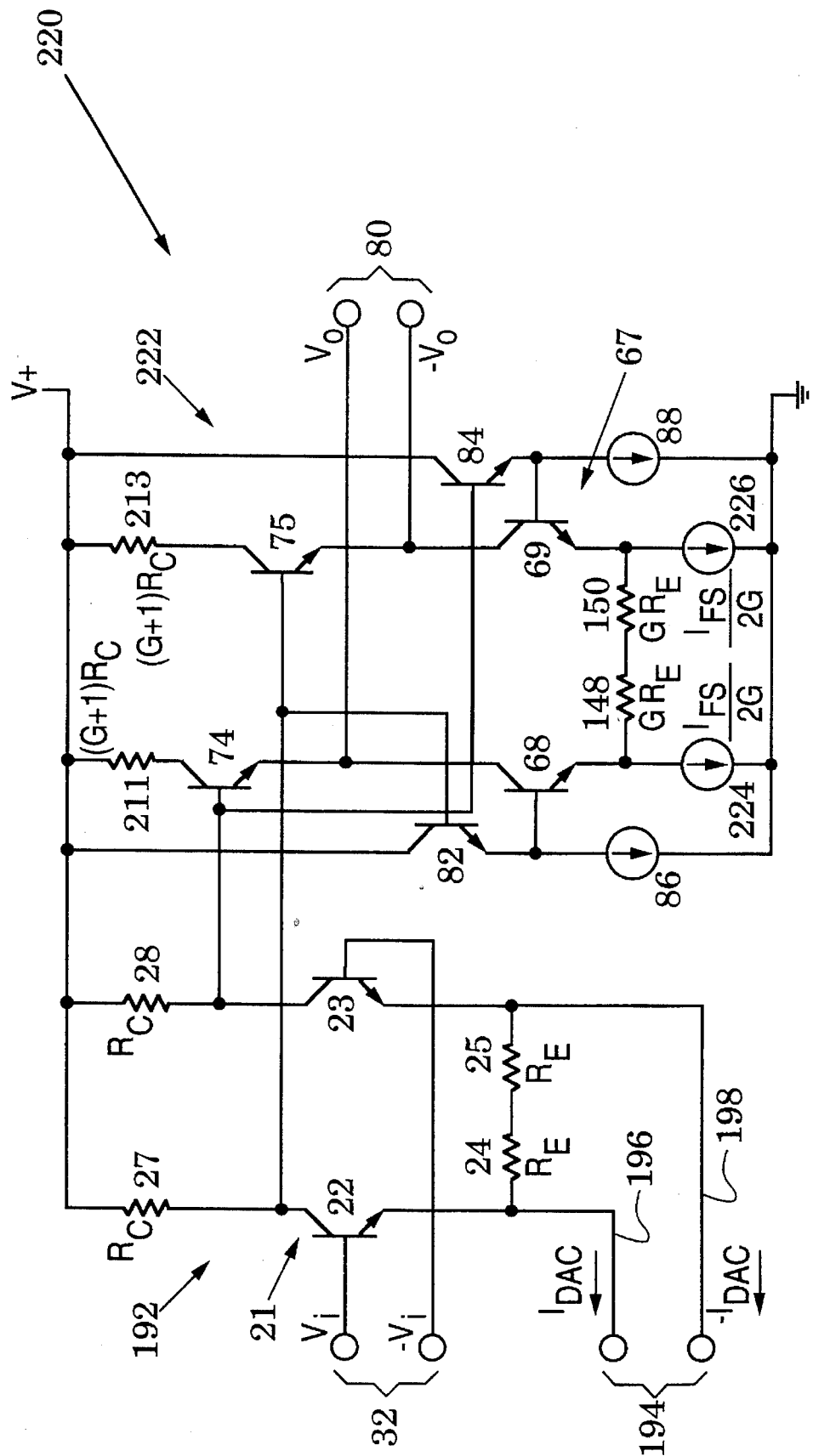
FIG. 14 is a schematic of another open-loop differential amplifier in accordance with the present invention.

Other embodiments which incorporate the teachings of the invention may be readily envisioned. For example, FIG. 14 illustrates another open-loop, differential amplifier 220. The amplifier 220 is similar to the amplifier 190 of FIG. 13 with like elements indicated by like reference numbers. However, the amplifier 220 has an output amplifier 222 in which the current source 146 of FIG. 13 has been replaced by two current sources 224 and 226. These current sources are respectively coupled to the emitters of transistors 68 and 69 and have a current value one half that of the current source 146.

In addition, the bases of the output differential pair 67 are connected through their respective buffer transistors 82 and 84 to the bases of the emitter followers 74 and 75, rather than to their emitters (or equivalently, the output port 80) as in the amplifier 190. In this amplifier embodiment, therefore, the cross-coupling path between the collector of each of the transistors of the differential pair 67 to the base of the other transistor of the differential pair includes a path portion through the base and emitter of a respective one of the coupling transistors 74 and 75.

The operation of the current sources 224 and 226 is substantially the same as that of the current source 146 because the total current is unchanged and it continues to be symmetrically distributed about the circuit node between the source resistors 148 and 150.

The cross-coupling in the amplifier 220 is operationally similar to the cross-coupling in the amplifier 190 of FIG. 13. In the amplifier 190, the amplifier's output voltage is used to steer current-source currents through the differential pair 67. By steering these currents with the output voltage of the input differential amplifier 192, only a small gain compensation error is introduced because of the base-emitter voltage drop of the coupling transistors 74 and 75.

Open-loop differential amplifiers in accordance with the invention are especially suited for use in high-speed applications that demand an accurate and stable gain. Embodiments of the invention have been described with respect to bipolar junction transistors. However, the teachings of the invention may be practiced with any device that exhibits transistance; the characteristic that makes possible the control of voltages or currents to accomplish gain or switching in a circuit. In particular, any device in which a signal at a control terminal (e.g., base or gate) regulates current through a current path defined between first and second current terminals (e.g., emitter and collector or source and drain). Examples of such devices include, but are not limited to, bipolar junction transistors and field effect transistors.

Although the teachings of the invention are preferably realized with differential transistor pairs that have associated differential collector and emitter elements, useful embodiments of the invention can also be formed with single-sided collector and emitter elements. For example, another amplifier embodiment can be formed by replacing resistors 25, 28 and 70 and coupling transistor 74 of the differential amplifier 60 of FIG. 2 with conductive paths.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A differential amplifier with an input port and an output port, said amplifier comprising:

first and second current sources;

a first differential pair of transistors that each have first and second current terminals which are responsive to a control terminal, said first differential pair arranged with their control terminals coupled to said input port and their first current terminals coupled to said first current source;

a second differential pair of transistors that each have first and second current terminals which are responsive to a control terminal, said second differential pair arranged with their first current terminals coupled to said second current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair; and a coupling transistor that has first and second current terminals which are responsive to a control terminal, said coupling transistor arranged with its first current terminal coupled to said output port and its control terminal coupled to said second current terminal of said first transistor of said first differential pair.

2. The differential amplifier of claim 1, wherein one of said coupling paths includes a path portion between said control terminal and said second current terminal of said coupling transistor.

3. A differential amplifier with an input port and an output port, said amplifier comprising:

first and second current sources;

a first differential pair of transistors that each have first and second current terminals which are responsive to a control terminal, said first differential pair arranged with their control terminals coupled to said input port and their first current terminals coupled to said first current source;

a second differential pair of transistors that each have first and second current terminals which are responsive to a control terminal, said second differential pair arranged with their first current terminals coupled to said second current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair;

a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a buffer transistor that has first and second current terminals which are responsive to a control terminal wherein said control terminal of said buffer transistor is coupled to said second current terminal of said first transistor of said second differential pair and said first current terminal of said buffer transistor is coupled to the control terminal of a second one of the transistors of said second differential pair;

said buffer transistor thereby forming a portion of one of said coupling paths.

4. The differential amplifier of claim 1, further including a first source resistor coupling the first current terminal of said first transistor of said first differential pair with said first current source.

5. A differential amplifier with an input port and an output port, said amplifier comprising:

first and second current sources;

a first differential pair of transistors that each have first and second current terminals which are responsive to a control terminal, said first differential pair arranged with their control terminals coupled to said input port and their first current terminals coupled to said first current source;

a second differential pair of transistors that each have first and second current terminals which are responsive to a control terminal, said second differential pair arranged with their first current terminals coupled to said second current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair;

a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a first source resistor coupling the first current terminal of said first transistor of said first differentiated pair with said first current source;

wherein said first current source supplies a first current; and said second current source supplies a second current substantially equal to 1/N times said first current;

and further including a second source resistor coupling the first current terminal of said first transistor of said second differential pair to said second current source wherein the ratio of the resistance of said second source resistor to the resistance of said first source resistor is substantially N.

6. A differential amplifier with an input port and an output port, said amplifier comprising:

first and second current sources;

a first differential pair of transistors that each have first and second current terminals which are responsive to a control terminal, said first differential pair arranged with their control terminals coupled to said input port and their first current terminals coupled to said first current source;

a second differential pair of transistors that each have first and second current terminals which are responsive to a control terminal, said second differential pair arranged with their first current terminals coupled to said second current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair;

a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a first source resistor coupling the first current terminal of said first transistor of said first differential pair with said first current source;

wherein the ratio of said first load resistor to said first source resistor is G;

said first current source supplies a first current; and said second current source supplies a second current substantially equal to 1/G times said first current;

and further including a second source resistor coupling the first current terminal of said first transistor of said second differential pair to said second current source wherein the ratio of the resistance of said second source resistor to the resistance of said first source resistor is substantially G.

7. The differential amplifier of claim 6, further including a second load resistor coupled to the second current terminal of said coupling transistor wherein the ratio of the resistance of said second load resistor to the resistance of said first load resistor is substantially G.

8. The differential amplifier of claim 6, further including a second load resistor coupled to the second current terminal of said coupling transistor wherein the ratio of the resistance of said second load resistor to the resistance of said first load resistor is substantially G+2.

9. A differential amplifier with an input port and an output port, said amplifier comprising:

first, second, third and fourth current sources;

a first differential pair of transistors that each have first and second current terminals which are responsive to a control terminal, said first differential pair arranged with their control terminals coupled to said first input port, one of their first current terminals coupled to said first current source and the other of their first current terminals coupled to said second current source;

a second differential pair of transistors that each have first and second current terminals which are responsive to a control terminal, said second differential pair arranged with one of their first current terminals coupled to said third current source and the other of their first current terminals coupled to said fourth current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair; and a coupling transistor that has first and second current terminals which are responsive to a control terminal, said coupling transistor arranged with its first current terminal coupled to said output port and its control terminal coupled to said second current terminal of said first transistor of said first differential pair.

10. The differential amplifier of claim 9, further including a first source resistor coupling the first current terminals of said first differential pair.

11. A differential amplifier with an input port and an output port, said amplifier comprising:

first, second, third and fourth current sources;

a first differential pair of transistors that each have first and second current terminals which are responsive to a control terminal, said first differential pair arranged with their control terminals coupled to said first input port, one of their first current terminals coupled to said first current source and the other of their first current terminals coupled to said second current source;

a second differential pair of transistors that each have first and second current terminals which are responsive to a control terminal, said second differential pair arranged with one of their first current terminals coupled to said third current source and the other of their first current terminals coupled to said fourth current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair;

a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a first source resistor coupling the first current terminals of said first differential pair;

wherein said first and second current sources each supplies a first current; and said third and fourth current sources each supplies a second current substantially equal to 1/N times said first current;

and further including a second source resistor coupling the first current terminals of said second differential pair wherein the ratio of the resistance of said second source resistor to the resistance of said first source resistor is substantially N.

12. A differential amplifier having first and second input ports and an output port with said second input port configured to receive a differential input current signal, said amplifier comprising:

a current source;

a first differential pair of transistors that each have first and second current terminals which are responsive to a control terminal, said first differential pair arranged with their control terminals coupled to said first input port and their first current terminals coupled to said second input port;

a second differential pair of transistors that each have first and second current terminals which are responsive to a control terminal, said second differential pair arranged with their first current terminals coupled to said current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair; and a coupling transistor that has first and second current terminals which are responsive to a control terminal, said coupling transistor arranged with its first current terminal coupled to said output port and its control terminal coupled to said second current terminal of said first transistor of said first differential pair.

13. The differential amplifier of claim 12, wherein one of said coupling paths includes a path portion between said control terminal and said second current terminal of said coupling transistor.

14. A differential amplifier having first and second input ports and an output port with said second input port configured to receive a differential input current signal, said amplifier comprising:

a current source;

a first differential pair of transistors that each have first and second current terminals which are responsive to a control terminal, said first differential pair arranged with their control terminals coupled to said first input port and their first current terminals coupled to said second input port; a second differential pair of transistors that each have first and second current terminals which are responsive to a control terminal, said second differential pair arranged with their first current terminals coupled to said current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair;

a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a buffer transistor that has first and second current terminals which are responsive to a control terminal;

and wherein said control terminal of said buffer transistor is coupled to said second current terminal of said first transistor of said second differential pair and said first current terminal of said buffer transistor is coupled to the control terminal of a second one of the transistors of said second differential pair;

said buffer transistor thereby forming a portion of one of said coupling paths.

15. The differential amplifier of claim 12, further including a first source resistor coupled between said first current terminals of said first differential pair.

16. A differential amplifier having first and second input ports and an output port with said second input port configured to receive a differential input current signal, said amplifier comprising:

a current source;

a first differential pair of transistors that each have first and second current terminals which are responsive to a control terminal, said first differential pair arranged with their control terminals coupled to said first input port and their first current terminals coupled to said second input port;

a second differential pair of transistors that each have first and second current terminals which are responsive to a control terminal, said second differential pair arranged with their first current terminals coupled to said current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair;

a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a first source resistor coupled between said first current terminals of said first differential pair wherein said current source supplies a current substantially equal to 1/N times said differential input current signal;

and further including a second source resistor coupling the first current terminal of said first transistor of said second differential pair to said current source wherein the ratio of the resistance of said second source resistor to the resistance of said first source resistor is substantially N.

17. A differential amplifier having first and second input ports and an output port with said second input port configured to receive a differential input current signal, said amplifier comprising:

a current source;

a first differential pair of transistors that each have first and second current terminals which are responsive to a control terminal, said first differential pair arranged with their control terminals coupled to said first input port and their first current terminals coupled to said second input port;

a second differential pair of transistors that each have first and second current terminals which are responsive to a control terminal, said second differential pair arranged with their first current terminals coupled to said current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair;

a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a first source resistor coupled between said first current terminals of said first differential pair wherein the ratio of said first load resistor to said first source resistor is G/2; and said current source supplies a current substantially equal to 1/G times said differential input current signal;

and further including a second source resistor coupling the first current terminal of said first transistor of said second differential pair to said current source wherein the ratio of the resistance of said second source resistor to the resistance of said first source resistor is substantially G/2.

18. The differential amplifier of claim 17, further including a second load resistor coupled to the second current terminal of said coupling transistor wherein the ratio of the resistance of said second load resistor to the resistance of said first load resistor is substantially G.

19. The differential amplifier of claim 17, further including a second load resistor coupled to the second current terminal of said coupling transistor wherein the ratio of the resistance of said second load resistor to the resistance of said first load resistor is substantially G+1.

20. A differential amplifier having first and second input ports and an output port with said second input port configured to receive a differential input current signal, said amplifier comprising:

first and second current sources;

a first differential pair of transistors that each have first and second current terminals which are responsive to a control terminal, said first differential pair arranged with their control terminals coupled to said first input port and their first current terminals coupled to said second input port;

a second differential pair of transistors that each have first and second current terminals which are responsive to a control terminal, said second differential pair arranged with one of their first current terminals coupled to said first current source, the other of their first current terminals coupled to said second current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair; and a coupling transistor that has first and second current terminals which are responsive to a control terminal, said coupling transistor arranged with its first current terminal coupled to said output port and its control terminal coupled to said second current terminal of said first transistor of said first differential pair.

21. The differential amplifier of claim 20, further including a first source resistor coupled between said first current terminals of said first differential pair.

22. A differential amplifier having first and second input ports and an output port with said second input port configured to receive a differential input current signal, said amplifier comprising:

first and second current sources;

a first differential pair of transistors that each have first and second current terminals which are responsive to a control terminal, said first differential pair arranged with their control terminals coupled to said first input port and their first current terminals coupled to said second input port;

a second differential pair of transistors that each have first and second current terminals which are responsive to a control terminal, said second differential pair arranged with one of their first current terminals coupled to said first current source, the other of their first current terminals coupled to said second current source and their second current terminals coupled to said output port wherein the second current terminal of each of the transistors of said second differential pair is coupled through a respective coupling path to the control terminal of the other transistor of said second differential pair;

a first load resistor coupled to the second current terminal of a first one of the transistors of said first differential pair; and a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a first source resistor coupled between said first current terminals of said first differential pair;

wherein each of said first and second current sources supplies a current substantially equal to ½N times said differential input current signal; and further including a second source resistor coupled between said first current terminals of said second differential pair wherein the ratio of the resistance of said second source resistor to the resistance of said first source resistor is substantially N.

23. A subranging analog-to-digital converter responsive to analog signals at a converter input, comprising:

a coarse-bit quantizer configured to produce digital signals at a coarse-bit quantizer output in response to analog signals at said converter input;

a reconstruction digital-to-analog converter configured to produce a differential full-scale current IFS in response to digital signals at said coarse-bit quantizer output;

a fine-bit quantizer configured to produce digital signals at a fine-bit quantizer output in response to analog signals at a fine-bit quantizer input; and a residue amplifier that includes;
 a) a current source;
 b) a first differential pair of transistors that each have first and second current terminals which are responsive to a control terminal, said first differential pair arranged with their control terminals coupled to said converter input and their first current terminals arranged to receive said differential current IFS;
 c) a second differential pair of transistors that each have first and second current terminals which are responsive to a control terminal, said second differential pair arranged with their first current terminals coupled to said current source and their second current terminals coupled to said fine-bit quantizer input wherein the second current terminal of each of the transistors of said second differential pair is coupled through a respective coupling path to the control terminal of the other transistor of said second differential pair;
 d) a first load resistor coupled to the second current terminal of a first one of the transistors of said first differential pair; and
 e) a coupling transistor that has first and second current terminals which are responsive to a control terminal, said coupling transistor arranged with its first current terminal coupled to said fine-bit quantizer input and its control terminal coupled to said second current terminal of said first transistor of said first differential pair.

24. The converter of claim 23, wherein one of said coupling paths includes a path portion between said control terminal and said second current terminal of said coupling transistor.

25. A subranging analog-to-digital converter responsive to analog signals at a converter input, comprising:

a coarse-bit quantizer configured to produce digital signals at a coarse-bit quantizer output in response to analog signals at said converter input;

a reconstruction digital-to-analog converter configured to produce a differential full-scale current IFS in response to digital signals at said coarse-bit quantizer output;

a fine-bit quantizer configured to produce digital signals at a fine-bit quantizer output in response to analog signals at a fine-bit quantizer input;

a residue amplifier that includes;
 a) a current source;
 b) a first differential pair of transistors that each have first and second current terminals which are responsive to a control terminal, said first differential pair arranged with their control terminals coupled to said converter input and their first current terminals arranged to receive said differential current IFS;
 c) a second differential pair of transistors that each have first and second current terminals which are responsive to a control terminal, said second differential pair arranged with their first current terminals coupled to said current source and their second current terminals coupled to said fine-bit quantizer input wherein the second current terminal of each of the transistors of said second differential pair is coupled through a respective coupling path to the control terminal of the other transistor of said second differential pair;

d) a first load resistor coupled to the second current terminal of a first one of the transistors of said first differential pair; and e) a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a buffer transistor that has first and second current terminals which are responsive to a control terminal;

and wherein said control terminal of said buffer transistor is coupled to said second current terminal of said first transistor of said second differential pair and said first current terminal of said buffer transistor is coupled to the control terminal of a second one of the transistors of said second differential pair;

said buffer transistor thereby forming a portion of one of said coupling paths.

26. The converter of claim 23, further including a first source resistor coupled between said first current terminals of said first differential pair.

27. A subranging analog-to-digital converter responsive to analog signals at a converter input, comprising:

a coarse-bit quantizer configured to produce digital signals at a coarse-bit quantizer output in response to analog signals at said converter input;

a reconstruction digital-to-analog converter configured to produce a differential full-scale current IFS in response to digital signals at said coarse-bit quantizer output;

a fine-bit quantizer configured to produce digital signals at a fine-bit quantizer output in response to analog signals at a fine-bit quantizer input;

a residue amplifier that includes;
a) a current source;
b) a first differential pair of transistors that each have first and second current terminals which are responsive to a control terminal, said first differential pair arranged with their control terminals coupled to said converter input and their first current terminals arranged to receive said differential current IFS;
c) a second differential pair of transistors that each have first and second current terminals which are responsive to a control terminal, said second differential pair arranged with their first current terminals coupled to said current source and their second current terminals coupled to said fine-bit quantizer input wherein the second current terminal of each of the transistors of said second differential pair is coupled through a respective coupling path to the control terminal of the other transistor of said second differential pair;
d) a first load resistor coupled to the second current terminal of a first one of the transistors of said first differential pair; and
e) a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a first source resistor coupled between said first current terminals of said first differential pair;

wherein said current source supplies a current substantially equal to IFS/N and further including a second source resistor coupling said first current terminal of said first transistor of said second differential pair to said current source wherein the ratio of the resistance of said second source resistor to the resistance of said first source resistor is substantially N/2.

28. A subranging analog-to-digital converter responsive to analog signals at a converter input, comprising:

a coarse-bit quantizer configured to produce digital signals at a coarse-bit quantizer output in response to analog signals at said converter input;

a reconstruction digital-to-analog converter configured to produce a differential full-scale current IFS in response to digital signals at said coarse-bit quantizer output;

a fine-bit quantizer configured to produce digital signals at a fine-bit quantizer output in response to analog signals at a fine-bit quantizer input;

a residue amplifier that includes;
a) a current source;
b) a first differential pair of transistors that each have first and second current terminals which are responsive to a control terminal, said first differential pair arranged with their control terminals coupled to said converter input and their first current terminals arranged to receive said differential current IFS;
c) a second differential pair of transistors that each have first and second current terminals which are responsive to a control terminal, said second differential pair arranged with their first current terminals coupled to said current source and their second current terminals coupled to said fine-bit quantizer input wherein the second current terminal of each of the transistors of said second differential pair is coupled through a respective coupling path to the control terminal of the other transistor of said second differential pair;
d) a first load resistor coupled to the second current terminal of a first one of the transistors of said first differential pair; and
e) a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and a first source resistor coupled between said first current terminals of said first differential pair;

wherein the ratio of said first load resistor to said first source resistor is G/2; and said current source supplies a current substantially equal to IFS/G;

and further including a second source resistor coupling said first current terminal of said first transistor of said second differential pair to said current source wherein the ratio of the resistance of said second source resistor to the resistance of said first source resistor is substantially G/2.

29. The converter of claim 28, further including a second load resistor coupled to the second current terminal of said coupling transistor wherein the ratio of the resistance of said second load resistor to the resistance of said first load resistor is substantially G.

30. The converter of claim 28, further including a second load resistor coupled to the second current terminal of said coupling transistor wherein the ratio of the resistance of said second load resistor to the resistance of said first load resistor is substantially G+1.

31. A subranging analog-to-digital converter responsive to analog signals at a converter input, comprising:
   a coarse-bit quantizer configured to produce digital signals at a coarse-bit quantizer output in response to analog signals at said converter input;
   a reconstruction digital-to-analog converter configured to produce a differential full-scale current IFS in response to digital signals at said coarse-bit quantizer output;
   a fine-bit quantizer configured to produce digital signals at a fine-bit quantizer output in response to analog signals at a fine-bit quantizer input; and
   a residue amplifier that includes;
      a) first and second current sources;
      b) a first differential pair of transistors that each have first and second current terminals which are responsive to a control terminal, said first differential pair arranged with their control terminals coupled to said converter input and their first current terminals arranged to receive said differential current IFS;
      c) a second differential pair of transistors that each have first and second current terminals which are responsive to a control terminal, said second differential pair arranged with one of their first current terminals coupled to said first current source, the other of their first current terminals coupled to said second current source and their second current terminals coupled to said fine-bit quantizer input wherein the second current terminal of each of the transistors of said second differential pair is coupled through a respective coupling path to the control terminal of the other transistor of said second differential pair;
      d) a first load resistor coupled to the second current terminal of a first one of the transistors of said first differential pair; and
      e) a coupling transistor that has first and second current terminals which are responsive to a control terminal, said coupling transistor arranged with its first current terminal coupled to said fine-bit quantizer input and its control terminal coupled to said second current terminal of said first transistor of said first differential pair.

32. The differential amplifier of claim 31, further including a first source resistor coupled between said first current terminals of said first differential pair.

33. A subranging analog-to-digital converter responsive to analog signals at a converter input, comprising:
   a coarse-bit quantizer configured to produce digital signals at a coarse-bit quantizer output in response to analog signals at said converter input;
   a reconstruction digital-to-analog converter configured to produce a differential full-scale current IFS in response to digital signals at said coarse-bit quantizer output;
   a fine-bit quantizer configured to produce digital signals at a fine-bit quantizer output in response to analog signals at a fine-bit quantizer input;
   a residue amplifier that includes;
      a) first and second current sources;
      b) a first differential pair of transistors that each have first and second current terminals which are responsive to a control terminal, said first differential pair arranged with their control terminals coupled to said converter input and their first current terminals arranged to receive said differential current IFS;
      c) a second differential pair of transistors that each have first and second current terminals which are responsive to a control terminal, said second differential pair arranged with one of their first current terminals coupled to said first current source, the other of their first current terminals coupled to said second current source and their second current terminals coupled to said output port wherein the second current terminal of each of the transistors of said second differential pair is coupled through a respective coupling path to the control terminal of the other transistor of said second differential pair;
      d) a first load resistor coupled to the second current terminal of a first one of the transistors of said first differential pair; and
      e) a coupling transistor that has first and second current terminals which are responsive to a control terminal, said coupling transistor arranged with its first current terminal coupled to the second current terminal of a first one of the transistors of said second differential pair and its control terminal coupled to said second current terminal of said first transistor of said first differential pair; and
   a first source resistor coupled between said first current terminals of said first differential pair;
   wherein each of said first and second current sources supplies a current substantially equal to ½N times said differential input current signal;
   and further including a second source resistor coupled between said first current terminals of said second differential pair wherein the ratio of the resistance of said second source resistor to the resistance of said first source resistor is substantially N.

* * * * *